(12) United States Patent
Ishige et al.

(10) Patent No.: US 10,777,965 B2
(45) Date of Patent: Sep. 15, 2020

(54) LASER APPARATUS AND LIGHT SOURCE APPARATUS

(71) Applicant: FURUKAWA ELECTRIC CO., LTD., Tokyo (JP)

(72) Inventors: Yuta Ishige, Tokyo (JP); Etsuji Katayama, Tokyo (JP); Atsushi Oguri, Tokyo (JP); Hajime Mori, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/261,632

(22) Filed: Jan. 30, 2019

(65) Prior Publication Data

US 2019/0157835 A1 May 23, 2019

Related U.S. Application Data

(63) Continuation of application No. PCT/JP2017/031902, filed on Sep. 5, 2017.

(30) Foreign Application Priority Data

Sep. 5, 2016 (JP) .................................. 2016-173114

(51) Int. Cl.
*H01S 5/022* (2006.01)
*H01S 5/40* (2006.01)
(Continued)

(52) U.S. Cl.
CPC ...... *H01S 5/02208* (2013.01); *H01S 3/06754* (2013.01); *H01S 3/0941* (2013.01);
(Continued)

(58) Field of Classification Search
CPC .... H01S 5/4018; H01S 5/022; H01S 5/02276; H01S 5/02208; H01S 5/02216;
(Continued)

(56) References Cited

U.S. PATENT DOCUMENTS 7,106,766 B2 * 9/2006 Ishida ................. H01S 5/02252
257/706
2003/0099267 A1 5/2003 Hennig et al.
(Continued)

FOREIGN PATENT DOCUMENTS

CN 201203679 Y 3/2009
CN 102272648 A 12/2011
(Continued)

OTHER PUBLICATIONS

International Search Report dated Nov. 7, 2017 in PCT/JP2017/031902 filed on Sep. 5, 2017 (with English Translation).
(Continued)

*Primary Examiner* — Armando Rodriguez
(74) *Attorney, Agent, or Firm* — Oblon, McClelland, Maier & Neustadt, L.L.P.

(57) ABSTRACT

Provided is a laser apparatus and a light source apparatus that can reduce the footprint and realize space-saving. The laser apparatus has a bottom plate; a semiconductor laser element mounted on the bottom plate; and a terminal unit that is provided so as to face upward with respect to the bottom plate and enables external electrical connection.

14 Claims, 10 Drawing Sheets

(51) Int. Cl.
  *H01S 3/067* (2006.01)
  *H01S 3/0941* (2006.01)
  *H01S 3/23* (2006.01)
  *H01S 3/094* (2006.01)

(52) U.S. Cl.
  CPC ........ *H01S 3/2383* (2013.01); *H01S 5/02216* (2013.01); *H01S 5/02284* (2013.01); *H01S 5/4012* (2013.01); *H01S 5/4025* (2013.01); *H01S 5/4075* (2013.01); *H01S 3/0675* (2013.01); *H01S 3/09415* (2013.01); *H01S 3/094003* (2013.01); *H01S 5/02272* (2013.01); *H01S 5/02276* (2013.01); *H01S 5/02288* (2013.01); *H01S 5/02292* (2013.01); *H01S 5/4018* (2013.01)

(58) Field of Classification Search
  CPC .. H01S 5/02284; H01S 5/4012; H01S 5/4025; H01S 5/4075; H01S 5/02272; H01S 5/02288; H01S 5/02292; H01S 3/2383; H01S 3/0941; H01S 3/06754; H01S 3/0675; H01S 3/094003; H01S 3/09415
  See application file for complete search history.

(56) References Cited

U.S. PATENT DOCUMENTS

| | | | |
|---|---|---|---|
| 2007/0036185 A1 | 2/2007 | Tanaka | |
| 2008/0025361 A1 | 1/2008 | Jerman | |
| 2009/0245315 A1* | 10/2009 | Faybishenko | G02B 6/4206 372/50.12 |
| 2012/0081893 A1 | 4/2012 | Faybishenko | |
| 2015/0131692 A1 | 5/2015 | Hayamizu et al. | |
| 2015/0229106 A1 | 8/2015 | Yabe | |
| 2019/0203908 A1* | 7/2019 | Kiyota | F21V 5/007 |

FOREIGN PATENT DOCUMENTS

| | | |
|---|---|---|
| CN | 102646922 A | 8/2012 |
| CN | 202383321 U | 8/2012 |
| CN | 202600259 U | 12/2012 |
| CN | 102916341 A | 2/2013 |
| CN | 20420528 U | 3/2015 |
| CN | 104836113 A | 8/2015 |
| CN | 104836119 A | 8/2015 |
| CN | 105207054 A | 12/2015 |
| CN | 105518505 A | 4/2016 |
| CN | 205141362 U | 4/2016 |
| CN | 205507157 U | 8/2016 |
| JP | H08-64712 A | 3/1996 |
| JP | 11-220191 | 8/1999 |
| JP | H11220191 A | 8/1999 |
| JP | 2000-347074 A | 12/2000 |
| JP | 2001-337250 A | 12/2001 |
| JP | 2003-338654 A | 11/2003 |
| JP | 2004-342779 | 12/2004 |
| JP | 2013-235943 | 11/2013 |
| JP | 5730814 | 6/2015 |
| JP | 2016-99573 A | 5/2016 |

OTHER PUBLICATIONS

Written Opinion dated Nov. 7, 2017 in PCT/JP2017/031902 filed on Sep. 5, 2017.
Chinese Office Action issued in counterpart Chinese Application No. 201780049200.5, dated Mar. 30, 2020 and English translation thereof, 15 pages.
Office Action dated Apr. 15, 2020 in German Patent Application No. DE 11 2017 004 448.0 with English translation thereof, 7 pages, citing Refs. AO and AP.
Combined Chinese Office Action and Search Report dated Jun. 1, 2020, in Patent Application No. 201780071878.6 (with English translation), citing documents AA and AO-AQ therein, 14 pages.
Combined Office Action and Search Report dated Jun. 30, 2020, Patent Application No. 201780071979.3 (with English translation), citing documents AA and AJ-AV, therein, 15 pages.

* cited by examiner

LASER APPARATUS AND LIGHT SOURCE APPARATUS

CROSS-REFERENCE TO RELATED APPLICATIONS

This application is a continuation application of International Application No. PCT/JP2017/031902, filed Sep. 5, 2017, which claims the benefit of Japanese Patent Application No. 2016-173114, filed Sep. 5, 2016. The contents of the aforementioned applications are incorporated herein by reference in their entireties.

TECHNICAL FIELD

The present invention relates to a laser apparatus having a semiconductor laser element and a light source apparatus having a plurality of laser apparatuses.

BACKGROUND ART

Semiconductor lasers are featured in small power consumption, compactness, and the like and have been widely used in various fields such as optical communication, optical recording, material processing, and the like. As a semiconductor laser module on which semiconductor lasers are implemented, a module in which a plurality of semiconductor lasers are provided inside a package is known (Patent Literature 1).

CITATION LIST

Patent Literature

Patent Literature 1: Japanese Patent No. 5730814

SUMMARY OF INVENTION

Technical Problem

There is now a demand for higher output power of an excitation light source in order to increase output power of an optical fiber laser using an optical fiber as a gain medium. Such higher output power of an excitation light source may be realized by arranging a plurality of semiconductor laser modules to form an excitation light source.

In the conventional semiconductor laser module, however, a bar-like electrode such as a lead pin projects out of a sidewall of a package casing. Thus, in a light source apparatus in which a plurality of semiconductor laser modules are arranged, the increased footprint thereof results in difficulty in space-saving.

The present invention has been made in view of the above and intends to provide a laser apparatus and a light source apparatus that can reduce the footprint to realize space-saving.

Solution to the Problem

According to one aspect of the present invention, provided is a laser apparatus having: a bottom plate; a semiconductor laser element mounted on the bottom plate; and a terminal unit that is provided so as to face upward with respect to the bottom plate and enables external electrical connection.

According to another aspect of the present invention, provided is a light source apparatus having: a plurality of laser apparatuses described above; and a base member having a mounting face on which the plurality of laser apparatuses are mounted.

According to yet another aspect of the present invention, provided is an optical fiber laser having: the light source apparatus described above; an amplifier optical fiber; and an incidence unit that causes laser lights output from the plurality of laser apparatuses of the light source apparatus to enter the amplifier optical fiber.

Advantageous Effects of Invention

According to the present invention, the footprint can be reduced, and space-saving can be realized.

DESCRIPTION OF EMBODIMENTS

First Embodiment

A laser apparatus and a light source apparatus according to a first embodiment of the present invention will be described by using FIG. 1A to FIG. 2B.

Figure 1A:
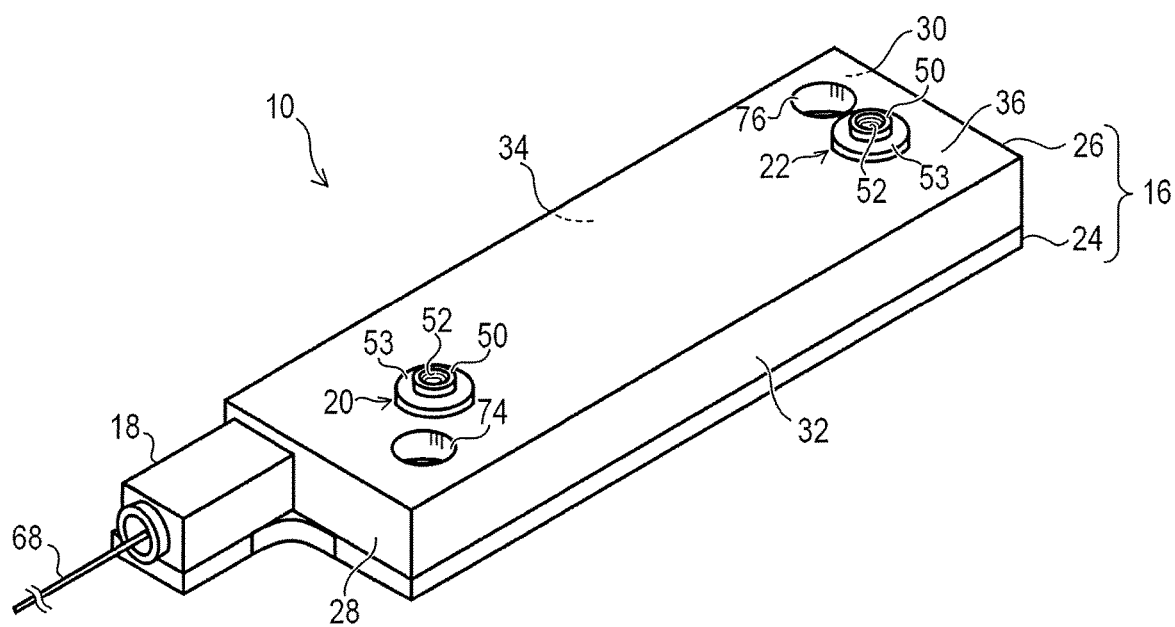
FIG. 1A is a schematic diagram illustrating a laser apparatus according to a first embodiment of the present invention.
Figure 1B:
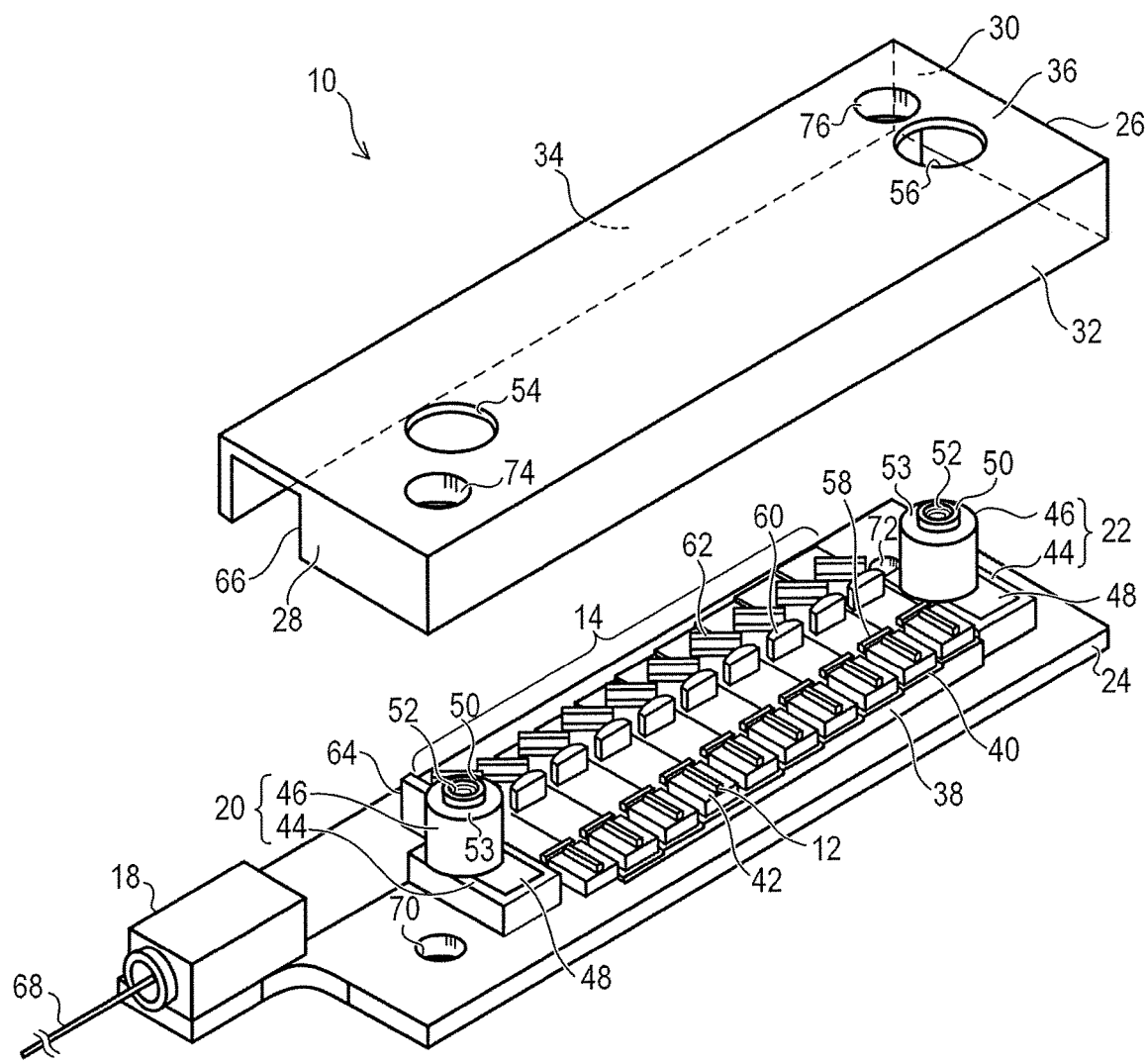
FIG. 1B is a schematic diagram illustrating the laser apparatus according to the first embodiment of the present invention.

First, the configuration of the laser apparatus according to the present embodiment will be described by using FIG. 1A and FIG. 1B. FIG. 1A is a perspective view illustrating the laser apparatus according to the present embodiment. FIG. 1B is an exploded perspective view illustrating the laser apparatus according to the present embodiment.

The laser apparatus according to the present embodiment is a semiconductor laser module having a plurality of semiconductor laser elements as laser elements. As illustrated in FIG. 1A and FIG. 1B, the laser apparatus 10 according to the present embodiment has a plurality of semiconductor laser elements 12 and an optical system 14 provided correspondingly to the plurality of semiconductor laser elements 12. Further, the laser apparatus 10 according to the present embodiment has a package casing 16 that accommodates the plurality of semiconductor laser elements 12, the optical system 14, and the like. Furthermore, the laser apparatus 10 according to the present embodiment has an output unit 18 from which a laser light is output and terminal units 20 and 22 that enable external electrical connection, respectively.

The casing 16 has a flat, substantially rectangular parallelepiped shape, for example, and has a bottom plate 24 and a cover 26. The cover 26 has a front sidewall 28 and a rear sidewall 30 facing each other in the longitudinal direction that is one the direction defining the casing 16 and a left sidewall 32 and a right sidewall 34 facing each other in the short direction that is a direction crossing the one direction defining the casing 16. Furthermore, the cover 26 has a top plate 36 provided above respective sidewalls 28, 30, 32, and 34 so as to face the bottom plate 24. The cover 26 is fixed on the bottom plate 24 so as to cover the plurality of semiconductor laser elements 12, the optical system 14, and the like provided on the bottom face of the bottom plate 24 with an internal space being secured. Note that the shape of the casing 16 is not particularly limited, and various shapes may be employed.

The plurality of semiconductor laser elements 12, the optical system 14, and a converging lens 64 described later are accommodated inside the casing 16. Further, portions of the terminal units 20 and 22 other than portions projecting out of the casing 16 are accommodated inside the casing 16, as described later.

The bottom plate 24 is a portion where, when the laser apparatus 10 is mounted on a substrate, the laser apparatus is mounted with the underside face thereof being in contact with the mounting face of the substrate, as described later. A step portion 38 is provided on the bottom plate 24. The step portion 38 has a stepwise shape and has a plurality of steps 40 provided to be arranged extending in the front-rear direction of the casing 16. The height of the plurality of steps 40 of the step portion 38 increases stepwise from the front side toward the rear side. The step portion 38 may be formed integrally with the bottom plate 24 or may be a separate component fixed to the bottom plate 24 by solder or the like.

The plurality of semiconductor laser elements 12 are provided on the bottom plate 24 and on the plurality of steps 40 of the step portion 38. The plurality of semiconductor laser elements 12 are the same semiconductor laser element having the same oscillation wavelength, output power, and other laser characteristics, for example. Note that the number of semiconductor laser elements 12 is not particularly limited and may be set as appropriate in accordance with laser output power or the like required for the laser apparatus 10.

The plurality of semiconductor laser elements 12 are separate independent elements from each other formed on separate chips. For example, each of the semiconductor laser elements 12 is mounted on the bottom plate 24 and on the plurality of steps 40 of the step portion 38 in a form of Chip On Submount (COS) by being fixed by solder or the like and mounted on a submount 42.

The plurality of semiconductor laser elements 12 mounted on the bottom plate 24 and on the plurality of steps 40 of the step portion 38 are aligned in a line along the longitudinal direction of the casing 16. A height difference due to the step portion 38 is provided between the plurality of semiconductor laser elements 12 aligned in a line. The plurality of semiconductor laser elements 12 are arranged such that the output direction of each laser light is directed in the short direction of the casing 16. The plurality of semiconductor laser elements 12 aligned in a line are arranged so as to output laser lights on the same side relative to the alignment. Note that the alignment of the plurality of semiconductor laser elements 12 may be not only provided in a line but also provided in multiple lines.

In the alignment of the plurality of semiconductor laser elements 12, electrodes of the adjacent semiconductor laser elements 12 are electrically connected by wire bonding or the like. Thereby, the plurality of semiconductor laser elements 12 are connected in series. Note that a scheme of electrically connecting the semiconductor laser elements 12 to each other is not particularly limited, various schemes may be used, and a scheme of wire bonding disclosed in Japanese Patent Application Publication No. 2015-185667 may be used, for example.

On the front side of the alignment of the plurality of semiconductor laser elements 12, the terminal unit 20 is provided on the bottom plate 24 inside the casing 16. Further, on the rear side of the alignment of the plurality of semiconductor laser elements 12, the terminal unit 22 is provided on the bottom plate 24 inside the casing 16. The terminal units 20 and 22 can be electrically connected to an external drive power source, respectively, and provided for applying a drive current from the drive power source to each of the plurality of semiconductor laser elements 12. One of the terminal units 20 and 22 is connected to the positive terminal of the drive power source, and the other of the terminal units 20 and 22 is connected to the negative terminal of the drive power source.

Each of the terminal units 20 and 22 has an element connection portion 44 and an external connection portion 46 electrically connected to the element connection portion 44. Each of the terminal units 20 and 22 has a connection scheme utilizing a screw for external electrical connection.

The element connection portion 44 of each of the terminal units 20 and 22 is provided on the bottom plate 24. In such a way, the element connection portion 44, which is a part of each of the terminal units 20 and 22, is provided on the bottom plate 24. The element connection portion 44 of each of the terminal units 20 and 22 has a sheet-like conductor 48. The sheet-like conductor 48 is provided in parallel to the bottom plate 24. The sheet-like conductor is electrically connected to the electrode of the semiconductor laser element 12 at the end of the alignment of the plurality of semiconductor laser elements 12 connected in series via a wire of wire bonding, for example.

More specifically, the sheet-like conductor 48 of the element connection portion 44 in the terminal unit 20 is electrically connected to the electrode of the semiconductor laser element 12 at the front end in the alignment of the plurality of semiconductor laser elements 12 connected in series via a wire of wire bonding. Further, the sheet-like conductor 48 of the element connection portion 44 in the terminal unit 22 is electrically connected to the electrode of the semiconductor laser element 12 at the rear end in the alignment of the plurality of semiconductor laser elements connected in series via a wire of wire bonding. Note that a scheme for electrically connecting the sheet-like conductor 48 of the element connection portion 44 to the electrode of the semiconductor laser element 12 is not limited to the scheme of wire bonding, and various schemes may be used.

The external connection portion 46 of each of the terminal units 20 and 22 is provided on the element connection portion 44. The external connection portion 46 of each of the terminal units 20 and 22 has a column-like conductor 50 formed in a column shape perpendicular to the bottom plate 24, for example, as a conductive part formed of a conductor. In each of the terminal units 20 and 22, the column-like conductor 50 is electrically connected to the sheet-like conductor 48. Each column-like conductor 50 has, at the upper end thereof, an internal-thread hole 52 opened upward. Each internal-thread hole 52 is used for external electrical connection, as described later. In such a way, the external connection portion 46 of each of the terminal units 20 and 22 is provided so as to face upward with respect to the bottom plate 24. That is, the external connection portion 46, which is a part of each of the terminal units 20 and 22, is provided on the opposite side of the mounting face where the bottom plate 24 is mounted and fixed and extends in a direction opposite to the mounting face. Note that the expression of upward with respect to the bottom plate 24 may include not only a case of being directed upward with respect to the bottom plate 24 in a direction orthogonal to the bottom plate 24 but also a case of being directed upward with respect to the bottom plate 24 in a direction inclined by a predetermined inclination angle relative the direction orthogonal to the bottom plate 24. That is, the upward direction relative to the bottom plate 24 may not only be a direction orthogonal to the bottom plate 24 but also be a direction inclined by a predetermined inclination angle relative to the direction orthogonal to the bottom plate 24.

Openings 54 and 56 are provided in the top plate 36 of the cover 26 correspondingly to the external connection portions 46 of the terminal units 20 and 22, respectively. The external connection portions 46 of the terminal units 20 and 22 partially project above the top plate 36, that is, outside the casing 16 via the openings 54 and 56 provided in the top plate 36, respectively. In such a way, the external connection portions 46 of the terminal units 20 and 22 partially project out of the casing 16 from the upper face of the casing 16, respectively. Each external connection portion 46 partially projecting out of the casing 16 directs the internal-thread hole 52 upward. Further, the external connection portions 46 of the terminal units 20 and 22 may each have an insulating portion 53 formed of an insulator. Each of the openings 54 and 56 provided in the top plate 36 and the corresponding column-like conductor 50 are in contact with each other via the insulating portion 53. Furthermore, each of the openings 54 and 56 provided in the top plate 36 and the corresponding column-like conductor 50 may be sealed with each other via the insulating portion 53. That is, gaps between the column-like conductor 50 and the opening 54 and between the column-like conductor 50 and the opening 56 may be sealed in an airtight manner by the insulating portions 53.

The external connection portion 46 of each of the terminal units 20 and 22 enables external electrical connection by utilizing a screw or a thread part that screwed with the internal-thread hole 52. For example, with a use of a screw that is screwed in the internal-thread hole 52, a bus bar that is a conductive bar is fixed to the external connection portion 46 in contact with the column-like conductor 50, and the external connection portion 46 can be externally electrically connected via the fixed bus bar. Further, an external terminal having an external-thread part screwed with the internal-thread hole 52 can be used to screw and fix the external-thread part of the external terminal with and to the internal-thread hole 52, and the external connection portion 46 can be externally electrically connected via the fixed external terminal. Further, an external terminal that is a round or Y-type crimp terminal, for example, can be fixed to the external connection portion 46 in contact with the column-like conductor 50 by using an external-thread screw screwed with the internal-thread hole 52, and the external connection portion 46 can be externally electrically connected via the fixed external terminal.

The optical system 14 is provided on one side of the alignment of the plurality of semiconductor laser elements 12. The optical system 14 has multiple sets of collimate lenses 58 and 60 and a reflective mirror 62. The multiple sets of the collimate lenses 58 and 60 and the reflective mirror 62 are mounted on the bottom plate 24 and on the plurality of steps 40 of the step portion 38 to correspond to the plurality of semiconductor laser elements 12. The plurality of collimate lenses 58 are of the same type having the same optical characteristics. The plurality of collimate lenses 60 are of the same type having the same optical characteristics. The plurality of reflective mirrors 62 are of the same type having the same optical characteristics.

In each sets of the collimate lenses 58 and 60 and the reflective mirror 62, the collimate lenses 58 and 60 are arranged in series on the output side of the laser light of the corresponding semiconductor laser element 12. Further, the reflective mirror 62 is arranged on the post-stage of the collimate lens 60. The collimate lenses 58 and 60 collimate the laser light output from the corresponding semiconductor laser element 12 vertically and horizontally, respectively, to form a parallel light. The reflective mirror 62 reflects the laser light collimated by the corresponding collimate lenses 58 and 60 to the front side by 90 degrees to guide the laser light to the front side of the casing 16 on which the output unit 18 is provided.

The output unit 18 is provided on the front end of the bottom plate 24. The converging lens 64 is provided between the output unit 18 and the optical system 14. A notch 66 to which the output unit 18 is fit is provided in the front sidewall 28 of the cover 26. The output unit 18 has an optical fiber 68 used for outputting a laser light and is able to output the laser light through the optical fiber 68. Note that the length of the optical fiber 68 can be changed as appropriate in accordance with design.

The optical fiber 68 of the output unit 18 has a fixed end that is an end fixed inside the casing 16 and an output end that is an end drawn out of the casing 16. The converging lens 64 together with the optical system 14 forms an optical system that causes the laser light output from the plurality of semiconductor laser elements 12 to enter the fixed end of the optical fiber 68. The converging lens 64 causes the laser light reflected by each of the plurality of reflective mirrors 62 to converge at and enter the fixed end of the optical fiber 68. The laser light that has entered the fixed end of the optical fiber 68 propagates in the optical fiber 68 and is output from the output end of the optical fiber 68 as the output of the laser apparatus 10. Note that the configuration of the optical system that causes a laser light to enter the fixed end of the optical fiber 68 may have a plurality of converging lenses including the converging lens 64 or may have various filters.

Further, through holes 70 and 72 through which a fixing screw is inserted are provided to the front end part and the rear end part of the bottom plate 24, respectively. The through holes 70 and 72 are located diagonally at corners. Through holes 74 and 76 through which a fixing screw is inserted are provided in the top plate 36 of the cover 26 to the through holes 70 and 72 provided in the bottom plate 24, respectively.

The laser apparatus 10 according to the present embodiment is used as a light source apparatus in which a plurality of the laser apparatuses 10 are aligned on a substrate, for example, as described later. Internal-thread holes each screwed with a fixing screw that is an external-thread screw are provided in the mounting face of the substrate on which the laser apparatuses 10 are aligned. Each laser apparatus 10 is attached and fixed to the mounting face of the substrate by using a fixing screw that is inserted through the through holes 70 and 74 and screwed with internal-thread hole provided in the substrate and using a fixing screw that is inserted through the through holes 72 and 76 and screwed with internal-thread hole provided in the substrate. Note that a scheme for fixing the laser apparatus 10 on the mounting face of the substrate is not particularly limited, and various schemes such as a scheme using a bolt and a nut, a scheme using an adhesive agent, or the like can be used other than the scheme using a fixing screw.

As discussed above, the laser apparatus 10 according to the present embodiment is formed.

When the laser apparatus 10 according to the present embodiment is operated, a drive current is applied to each of the plurality of semiconductor laser elements 12 connected in series from an external drive power source electrically connected to the terminal units 20 and 22. In response to the drive current being applied, each of the semiconductor laser elements 12 starts laser oscillation and outputs a laser light. After collimated by the corresponding collimate lenses 58 and 60, the laser light output from each of the semiconductor laser elements 12 is reflected by the corresponding reflective mirror 62 and guided to the converging lens 64. The laser light reflected by each reflective mirror 62 is converged by the converging lens 64 and enters the fixed end of the optical fiber 68 of the output unit 18. The laser light that has entered the fixed end of the optical fiber 68 is output from the output end of the optical fiber 68 as the output of the laser apparatus 10.

Figure 2A:
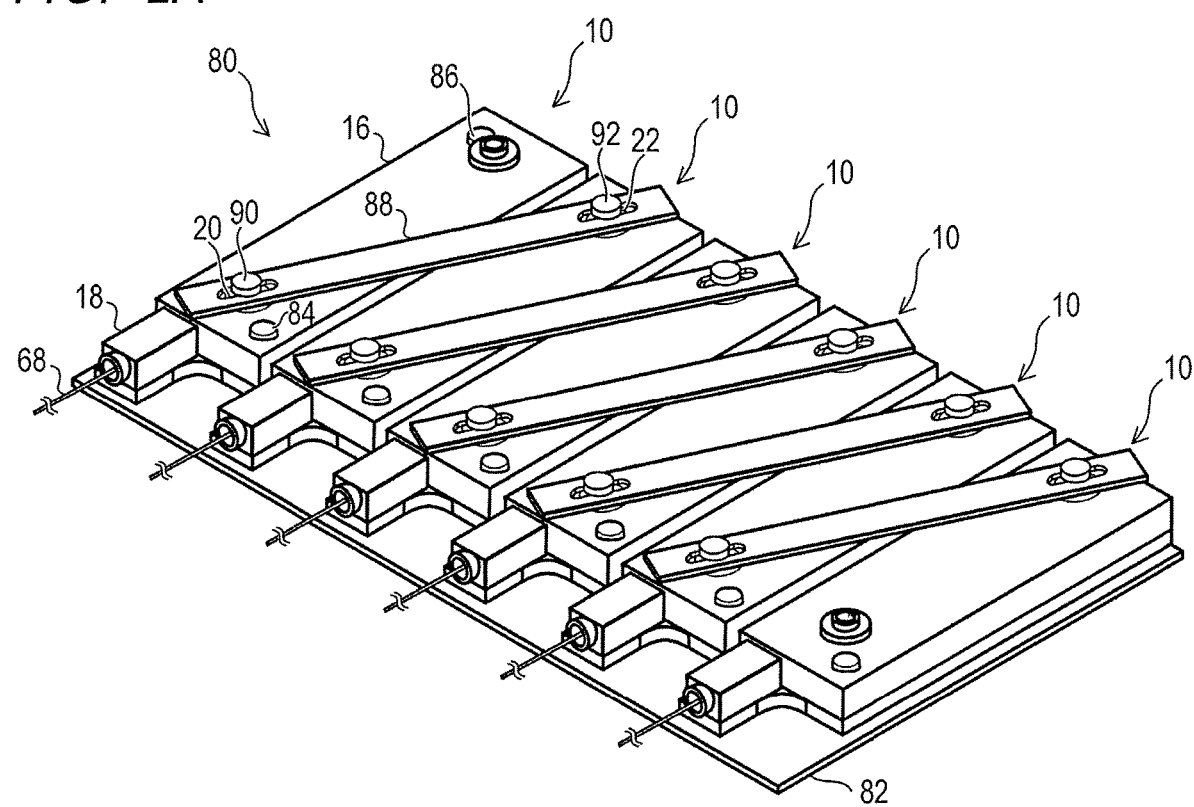
FIG. 2A is a schematic diagram illustrating a light source apparatus according to the first embodiment of the present invention.
Figure 2B:
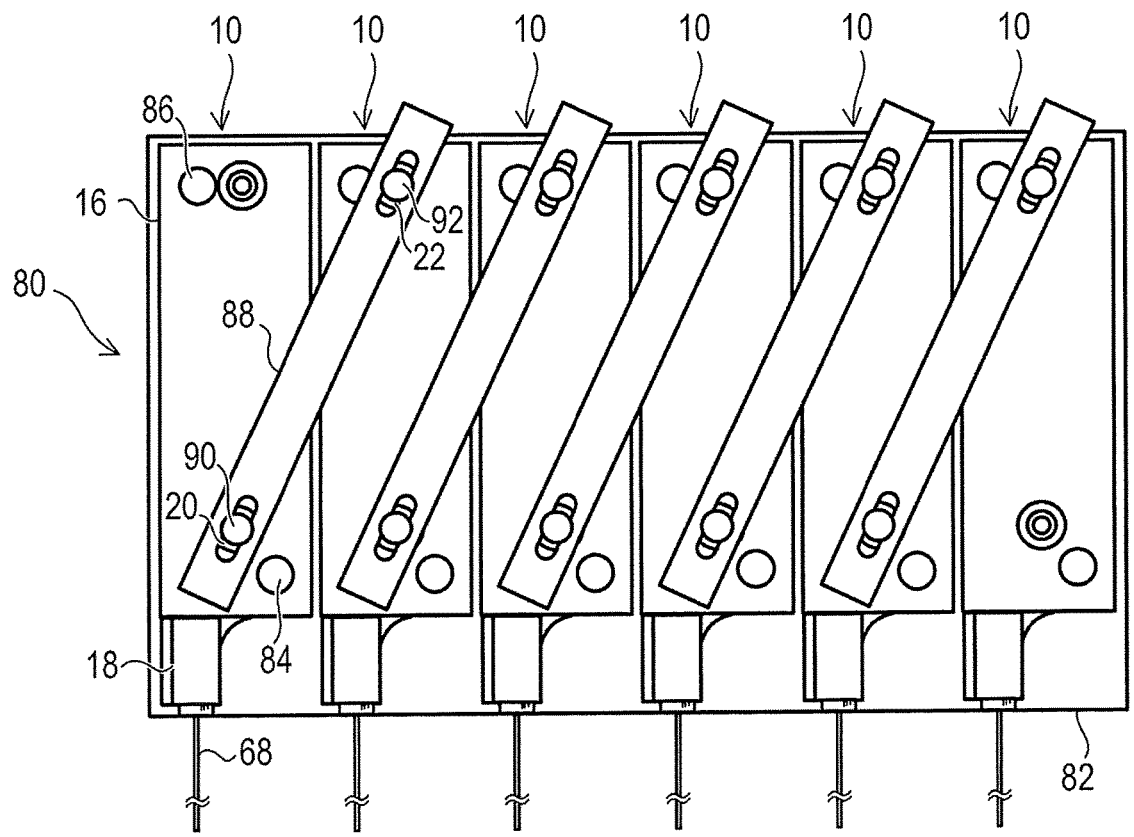
FIG. 2B is a schematic diagram illustrating the light source apparatus according to the first embodiment of the present invention.

The laser apparatus 10 according to the present embodiment can form a light source apparatus when a plurality of the laser apparatuses 10 are aligned. The use of the plurality of laser apparatuses 10 can increase the output power of the light source apparatus. The light source apparatus according to the present embodiment in which the plurality of laser apparatuses 10 are aligned will be described below by using FIG. 2A and FIG. 2B. FIG. 2A is a perspective view illustrating the light source apparatus according to the present embodiment. FIG. 2B is a plan view illustrating the light source apparatus according to the present embodiment.

As illustrated in FIG. 2A and FIG. 2B, a light source apparatus 80 according to the present embodiment has a substrate 82, and the plurality of laser apparatuses 10 aligned and mounted on the substrate 82. Note that the number of the plurality of laser apparatuses 10 is not particularly limited and can be set as appropriate in accordance with the laser output power or the like required for the light source apparatus 80.

The substrate 82 has a mounting face on which the plurality of aligned laser apparatuses 10 are mounted and is a base member that supports the plurality of laser apparatuses 10 mounted on the mounting face. Each of the plurality of laser apparatuses 10 is attached and fixed on the mounting face of the substrate 82 with the bottom plate 24 side facing the substrate 82 side. Each laser apparatus is attached and fixed to the mounting face of the substrate 82 by using a fixing screw 84 inserted through the through holes 70 and 74 and screwed with the internal-thread hole of the substrate 82 and using a fixing screw 86 inserted through the through holes 72 and 76 and screwed with the internal-thread hole of the substrate 82, as described above.

The plurality of laser apparatuses 10 mounted on the mounting face of the substrate 82 are aligned laterally in a line in an alignment direction that is the longitudinal direction of the substrate 82, for example. The plurality of laser apparatuses 10 aligned in a line have the output units 18 oriented to the same side with respect to the alignment. Each of the plurality of laser apparatuses 10 are arranged such that the longitudinal direction of the casing 16 is orthogonal to the alignment direction of the plurality of laser apparatuses 10. Note that the oblique angle of the laser apparatus 10 relative to the alignment direction is not particularly limited and can be set as appropriate.

With respect to two adjacent laser apparatuses 10, the terminal unit 20 of one laser apparatuses 10 and the terminal unit 22 of the other laser apparatus 10 are electrically connected by the bus bar 88 that is a conductive bar. One end of the bus bar 88 is fixed to the terminal unit 20 and electrically connected to the terminal unit 20 by using a fixing screw 90 that is screwed with the internal-thread hole 52 of the terminal unit 20 of the one laser apparatus 10. The other end of the bus bar 88 is fixed to the terminal unit 22 and electrically connected to the terminal unit 22 by using a fixing screw 92 that is screwed with the internal-thread hole 52 of the terminal unit 22 of the other laser apparatus 10. In such a way, the plurality of laser apparatuses 10 are connected in series. Note that a scheme for electrically connecting the plurality of laser apparatuses 10 to each other is not limited to the scheme using the bus bars 88, and various schemes such as a scheme using a lead wire can be used.

As discussed above, the light source apparatus 80 according to the present embodiment is formed.

Figure 3:
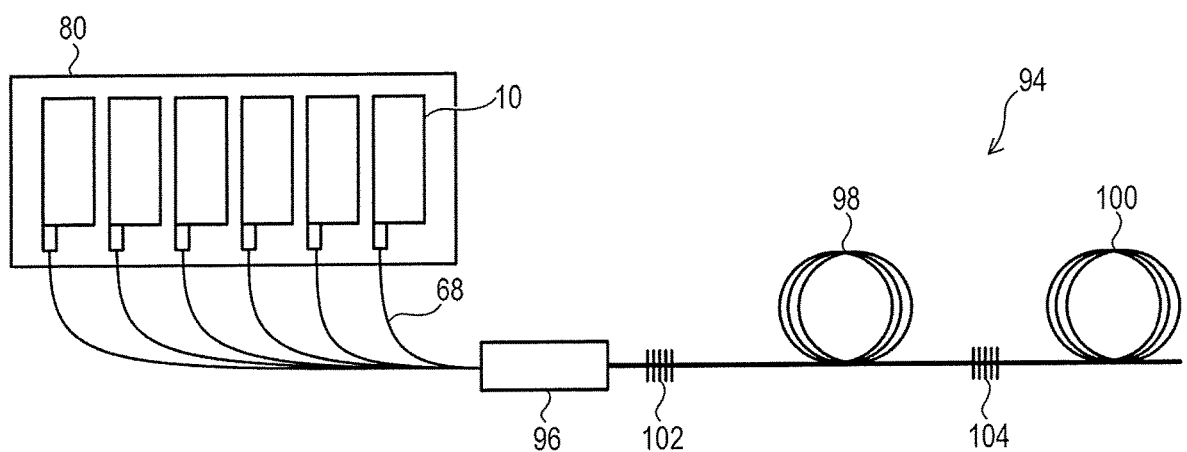
FIG. 3 is a schematic diagram illustrating an optical fiber laser using the light source apparatus as an excitation light source according to the first embodiment of the present invention.

The light source apparatus 80 according to the present embodiment can be used as an excitation light source of an optical fiber laser, for example. An optical fiber laser in which the light source apparatus 80 according to the present embodiment is used as an excitation light source will now be described by using FIG. 3. FIG. 3 is a schematic diagram illustrating the optical fiber laser in which the light source apparatus 80 according to the present embodiment is used as an excitation light source.

As illustrated in FIG. 3, an optical fiber laser 94 in which the light source apparatus 80 according to the present embodiment is used as an excitation light source has the light source apparatus 80 as an excitation light source and a pump combiner 96 as an optical coupling unit. Further, the optical fiber laser 94 has a rare-earth additive optical fiber 98 as an amplifier optical fiber and an output-side optical fiber 100. A high reflective Fiber Bragg Grating (FBG) 102 and a low reflective FBG 104 are provided to the input end and the output end of the rare-earth additive optical fiber 98, respectively.

The output ends of the optical fibers 68 of the output units 18 in the plurality of laser apparatuses 10 included in the light source apparatus 80 are coupled to the plurality of input ports of the multiple-input single-output type pump combiner 96, respectively. The input end of the rare-earth additive optical fiber 98 is connected to the output port of the pump combiner 96. The input end of the output-side optical fiber 100 is connected to the output end of the rare-earth additive optical fiber 98. Note that, as an incidence part at which the laser lights output from the plurality of laser apparatuses 10 are caused to enter the rare-earth additive optical fiber 98, other configurations may be used instead of the pump combiner 96. For example, the incidence part may be configured such that the optical fibers 68 of the output units 18 in the plurality of laser apparatuses 10 are arranged, and the laser lights output from the plurality of optical fibers 68 are caused to enter the input end of the rare-earth additive optical fiber 98 by using the incidence part such as an optical system including a lens.

As discussed above, the optical fiber laser 94 in which the light source apparatus 80 according to the present embodiment is used as the excitation light source is formed.

In the optical fiber laser 94, the laser lights output from the optical fibers 68 of the plurality of laser apparatuses 10 are coupled by the pump combiner 96 and output from the output port thereof. The pump combiner 96 as the incidence part causes the laser light as an excitation light output from the output port thereof to enter the input end of the rare-earth additive optical fiber 98. In the rare-earth additive optical fiber 98, a resonator including the rare-earth additive optical fiber 98 is formed by the high reflective FBG 102 and the low reflective FBG 104.

In the rare-earth additive optical fiber 98 that is an amplifier optical fiber, a propagating excitation light is absorbed in rare-earth elements doped in the core, an inverted population occurs between the ground level and the metastable level, and a light is emitted. The light emitted in such a way causes laser oscillation due to an optical amplification effect of the rare-earth additive optical fiber 98 and an effect of the laser resonator formed of the high reflective FBG 102 and the low reflective FBG 104. A laser light is generated by laser oscillation in such a way. The generated laser light is output from the output end of the output-side optical fiber 100 connected to the output end of the rare-earth additive optical fiber 98.

In the laser apparatus 10 according to the present embodiment, the terminal units 20 and 22 that enable external electrical connection are provided so as to face upward with respect to the bottom plate 24 mounted on the mounting face of the substrate 82, as described above. Thus, when the plurality of laser apparatuses 10 are aligned in the lateral direction as illustrated in FIG. 2A and FIG. 2B to form the light source apparatus 80, for example, there is no need to secure the space for the terminal units 20 and 22, and the footprint of the light source apparatus 80 can be reduced. Thereby, space-saving can be realized.

Figure 11A:
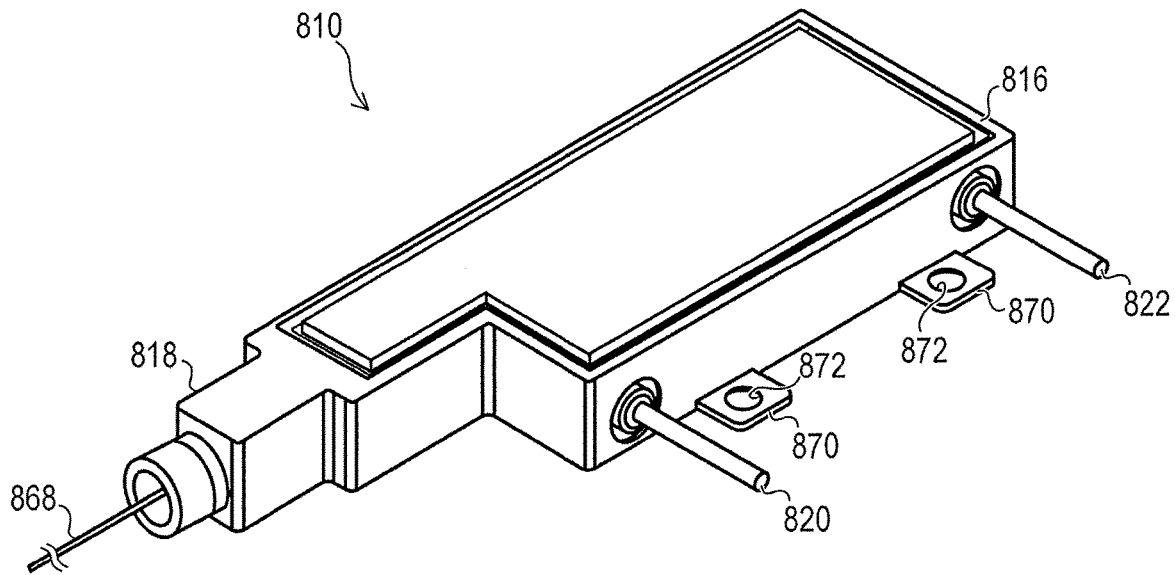
FIG. 11A is a schematic diagram illustrating a laser apparatus according to a reference example.
Figure 11B:
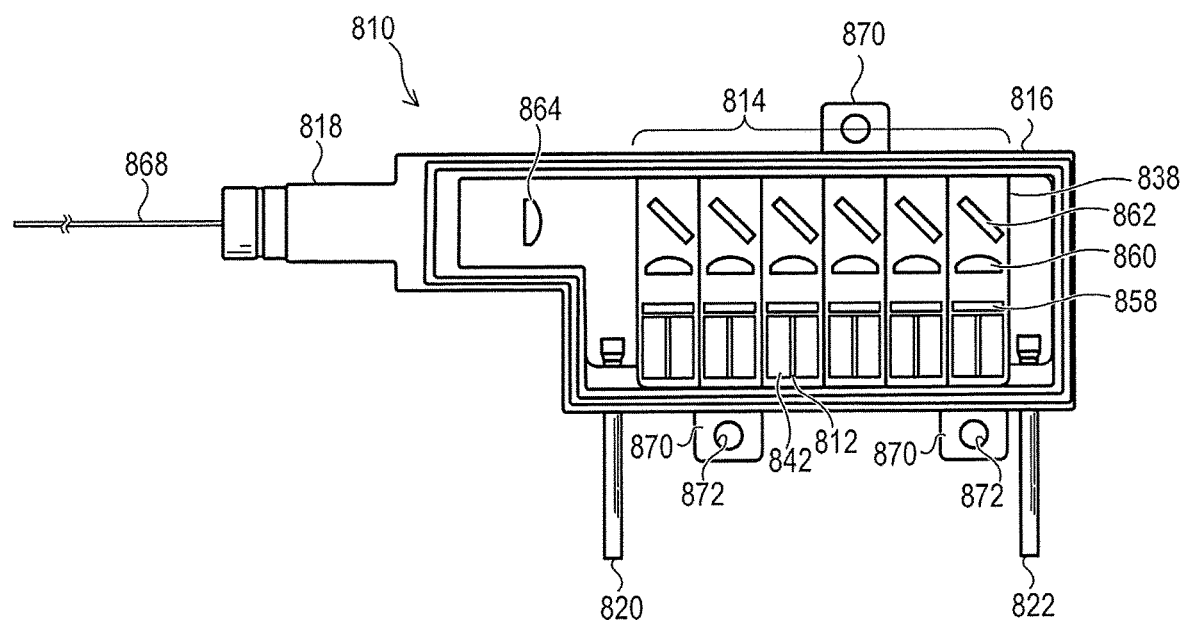
FIG. 11B is a schematic diagram illustrating the laser apparatus according to the reference example.

On the other hand, unlike the laser apparatus 10 according to the present embodiment, it is difficult to realize space-saving when a terminal unit arranged horizontally with respect to the bottom plate of the casing is provided on the sidewall of the casing. A laser apparatus according to a reference example in which the terminal unit arranged horizontally with respect to the bottom plate of the casing is provided on the sidewall of the casing will now be described by using FIG. 11A and FIG. 11B. FIG. 11A is a perspective view illustrating the laser apparatus according to the reference example. FIG. 11B is a transparent plan view illustrating a laser apparatus according to the reference example.

As illustrated in FIG. 11A and FIG. 11B, the laser apparatus 810 according to the reference example has a plurality of semiconductor laser elements 812 and an optical system 814 provided correspondingly to the plurality of semiconductor laser elements 812. Further, the laser apparatus 810 according to the reference example has a casing 816 that accommodates the plurality of semiconductor laser elements 812, the optical system 814, and the like. Further-more, the laser apparatus 810 according to the reference example has an output unit 818 from which a laser light is output and lead pins 820 and 822 that are terminal units which enable external electrical connection, respectively.

The plurality of semiconductor laser elements 812 are the same as the plurality of semiconductor laser elements 12 described above. The optical system 814 is also the same as the optical system 14 described above and has multiple sets of collimate lenses 858 and 860 and a reflective mirror 862 that are the same as the collimate lenses 58 and 60 and the reflective mirror 62 described above. The plurality of semiconductor laser elements 812 and multiple sets of the collimates lenses 858 and 860 and the reflective mirror 862 are mounted on the steps of a step portion 838 that is the same as the step portion 38 described above in the same manner as above. For example, each of the semiconductor laser elements 812 is mounted in a form of COS by being fixed and mounted by solder or the like on the submount 842.

The output unit 818 is provided to the front end of the casing 816. A converging lens 864 that is the same as the converging lens 64 described above is provided between the output unit 818 and the optical system 814. The output unit 818 has an optical fiber 868 used for outputting a laser light in the same manner as the output unit 18 described above. The optical fiber 868 has a fixed end fixed inside the casing 816 and an output end outside the casing 816 from which a laser light is output. The converging lens 864 causes the laser lights reflected by respective reflective mirrors 862 to converge at and enter the fixed end of the optical fiber 868. The laser light that has converged at and entered the fixed end of the optical fiber 868 is output from the output end of the optical fiber 868 as the output of the laser apparatus 810.

Lead pins 820 and 822 are provided on the front side and the rear side of the alignment of the plurality of semiconductor laser elements 812, respectively, in the sidewall of the casing 816. The lead pins 820 and 822 pass through and project horizontally out of the sidewall of the casing 816 and are arranged horizontally with respect to the bottom plate of the casing 816, respectively. The lead pins 820 and 822 function as terminal units electrically connected to an external drive power source and are used for applying a drive current to each of the plurality of semiconductor laser elements 812 from the drive power source.

A plurality of fixing portions 870 projecting horizontally are provided on the lower end of the sidewall of the casing 816. A through hole 872 through which a fixing screw is inserted is provided in each fixing portion 870. The laser apparatus 810 is used as a light source apparatus in which a plurality of the laser apparatuses 810 are aligned on a substrate, for example, in the same manner as the laser apparatus 10 described above. Internal-thread holes each screwed with a fixing screw that is an external-thread screw are provided in the mounting face of the substrate on which the laser apparatuses 810 are aligned. Each laser apparatus 810 is attached and fixed to the mounting face of the substrate by using a fixing screw that is inserted through the through hole 872 provided in each fixing portion 870 and screwed with the internal-thread hold provided in the mounting face of the substrate.

As discussed above, the laser apparatus 810 according to the reference example is formed.

When the laser apparatus 810 according to the reference example described above is configured such that the light source apparatuses are aligned in the lateral direction on the substrate, the lead pins 820 and 822 facing horizontally with respect to the bottom plate of the casing 816 project in the horizontal direction. Thus, in the laser apparatus 810 according to the reference example, the footprint of the light source apparatus increases resulting in difficulty in space-saving.

Figure 12:
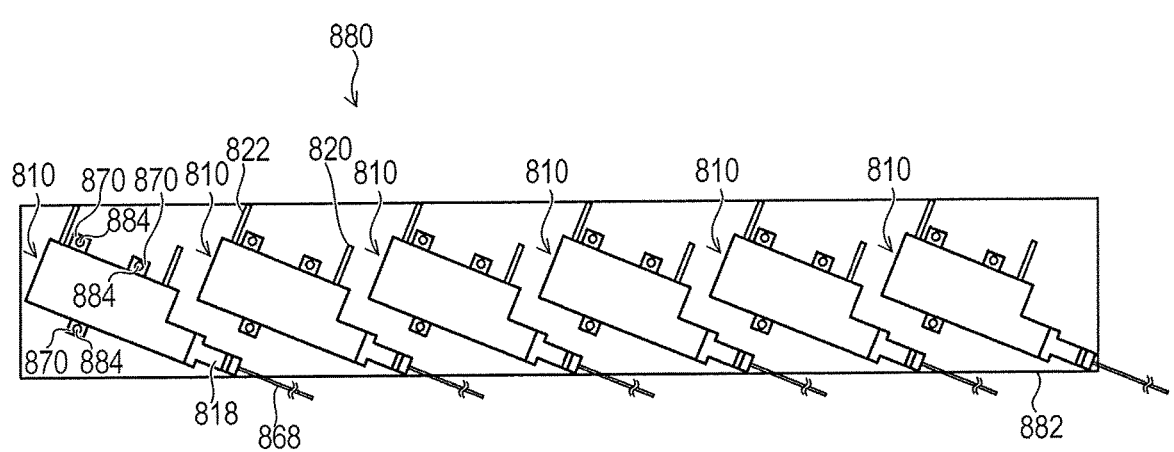
FIG. 12 is a plan view illustrating a light source apparatus according to the reference example.

FIG. 12 is a plan view illustrating a light source apparatus according to the reference example configured such that the plurality of laser apparatuses 810 according to the reference example are aligned in the lateral direction. As illustrated in FIG. 12, the light source apparatus 880 according to the reference example has a substrate 882 and the plurality of laser apparatuses 810 according to the reference example aligned and mounted on the substrate 882.

Each of the plurality of laser apparatuses 810 is attached on the mounting face of the substrate 882 with the bottom plate side of the casing 816 facing the substrate 882 side. Each of the laser apparatuses 810 is attached and fixed to the mounting face of the substrate 882 by using a fixing screw 884 that is inserted through the through hole 872 of the fixing portion 870 and screwed with the internal-thread hole of the substrate 882, as described above.

The plurality of laser apparatuses 810 mounted on the mounting face of the substrate 882 are aligned laterally in a line in an alignment direction that is the longitudinal direction of the substrate 882, for example. The plurality of laser apparatuses 810 aligned in a line have the output units 818 oriented to the same side with respect to the alignment. Each of the plurality of laser apparatuses 810 are arranged such that the longitudinal direction of the casing 816 is inclined by a predetermined oblique angle relative to the alignment direction of the plurality of laser apparatuses 810.

Of two adjacent laser apparatuses 810, the lead pin 820 of the one laser apparatus 810 and the lead pin 822 of the other laser apparatus 810 are electrically connected by soldering.

As discussed above, the light source apparatus 880 according to the reference example is formed.

In the laser apparatus 810 according to the reference example, the lead pins 820 and 822 provided horizontally with respect to the bottom plate of the casing 816 mounted on the mounting face of the substrate 882 project horizontally. Thus, when the plurality of laser apparatuses 810 according to the reference example are aligned in the lateral direction to form the light source apparatus 880, it is necessary to secure a space for the lead pins 820 and 822, and the footprint of the light source apparatus 880 increases for the space.

Further, since the lead pins 820 and 822 are typically connected to other terminals by soldering, the workload increases for the soldering. Further, in general, work efficiency of the soldering of the lead pins 820 and 822 is not good.

In contrast, in the laser apparatus 10 according to the present embodiment, since the terminal units 20 and 22 are provided so as to face upward with respect to the bottom plate 24 of the casing 16 when aligned as illustrated in FIG. 2A and FIG. 2B, it is not necessary to secure the space for the terminal units 20 and 22. Thus, in the laser apparatus 10 according to the present embodiment, the footprint of the light source apparatus 80 can be reduced compared to the laser apparatus 810 according to the reference example. Therefore, according to the laser apparatus 10 of the present embodiment, space-saving can be realized.

Furthermore, in the laser apparatus 10 according to the present embodiment, each of the terminal units 20 and 22 has the internal-thread hole 52 and is externally electrically connected by a screw. Thus, according to the laser apparatus 10 of the present embodiment, it is not necessary to perform soldering as in the case of using lead pins. Therefore, according to the laser apparatus 10 of the present embodiment, it is possible to ensure high work efficiency in external electrical connection.

Further, in the laser apparatus 10 according to the present embodiment, the external connection portion 46 of each of the terminal units 20 and 22 projects partially above the top plate 36, that is, out of the casing 16. With the external connection portion 46 projecting in such a way, according to the laser apparatus 10 of the present embodiment, it is possible to provide external electrical connection with high work efficiency, for example, it is possible to utilize the bus bar 88 that facilitates connecting work as described above, or the like.

Furthermore, in the laser apparatus 10 according to the present embodiment, it is not necessary to use a lead pin applied with an expensive hermetic seal. Therefore, according to the laser apparatus 10 of the present embodiment, lower cost can be realized.

As discussed above, according to the present embodiment, the footprint can be reduced to realize space-saving, and high work efficiency can be ensured for external electrical connection.

Second Embodiment

A laser apparatus and a light source apparatus according to a second embodiment of the present invention will be described by using FIG. 4 and FIG. 5. Note that the same components as those of the laser apparatus and the light source apparatus according to the first embodiment described above are labeled with the same reference numerals, and the description thereof will be omitted or simplified.

The basic configuration of the laser apparatus according to the present embodiment is the same as the configuration of the laser apparatus 10 according to the first embodiment. The laser apparatus according to the present embodiment is different from the laser apparatus 10 according to the first embodiment in that fixing portions are provided instead of the through holes 70 and 72 in the bottom plate 24 and the through holes 74 and 76 in the top plate 36 used for attaching and fixing the laser apparatus 10 on the mounting face of the substrate.

Figure 4:
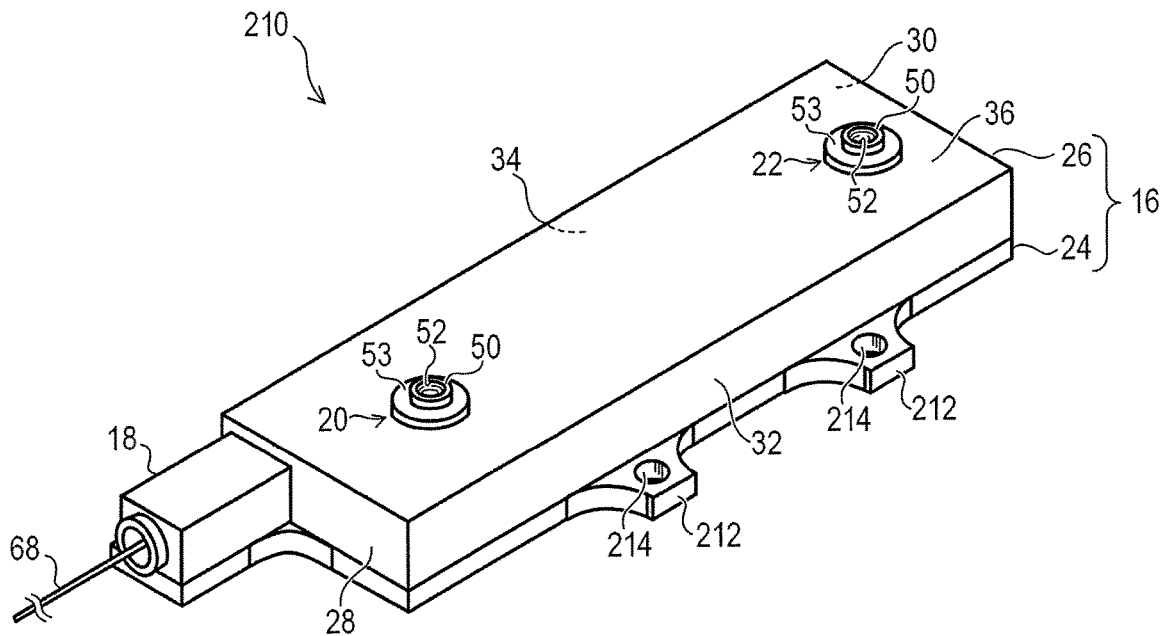
FIG. 4 is a perspective view illustrating a laser apparatus according to a second embodiment of the present invention.

FIG. 4 is a perspective view illustrating the laser apparatus according to the present embodiment. As illustrated in FIG. 4, a laser apparatus 210 according to the present embodiment has a plurality of fixing portions 212 provided to the bottom plate 24 of the casing 16. Note that, in the laser apparatus 210 according to the present embodiment, unlike the laser apparatus 10 according to the first embodiment, the through holes 70 and 72 are not provided in the bottom plate 24, and the through holes 74 and 76 are not provided in the top plate 36.

Each of the fixing portions 212 is provided to the bottom plate 24 so as to project out of the casing 16 from the bottom plate 24. For example, of two edges extending in the longitudinal direction of the bottom plate 24, two fixing portions 212 are provided to one of the edges, and one fixing portion 212 is provided to the other. Note that the number and the position of the fixing portions 212 are not particularly limited and can be changed as appropriate.

A through hole 214 through which a fixing screw is inserted is provided in each fixing portion 212. The laser apparatus 210 is used as a light source apparatus in which a plurality of laser apparatuses 210 are aligned on the mounting face of the substrate, for example, in the same manner as the laser apparatus 10. Internal-thread holes with which fixing screws that are an external-thread screw are screwed are provided on the mounting face of the substrate on which the laser apparatuses 210 are aligned. The laser apparatuses 210 are attached and fixed to the mounting face of the substrate by using fixing screws that are inserted through the through hole 214 of respective fixing portions 212 and screwed with internal-thread holes provided on the mounting face of the substrate. Note that a scheme for fixing the laser apparatus 210 on the mounting face of the substrate is not particularly limited, and various schemes such as a scheme using a bolt and a nut, or the like can be used other than the scheme using a fixing screw.

Figure 5:
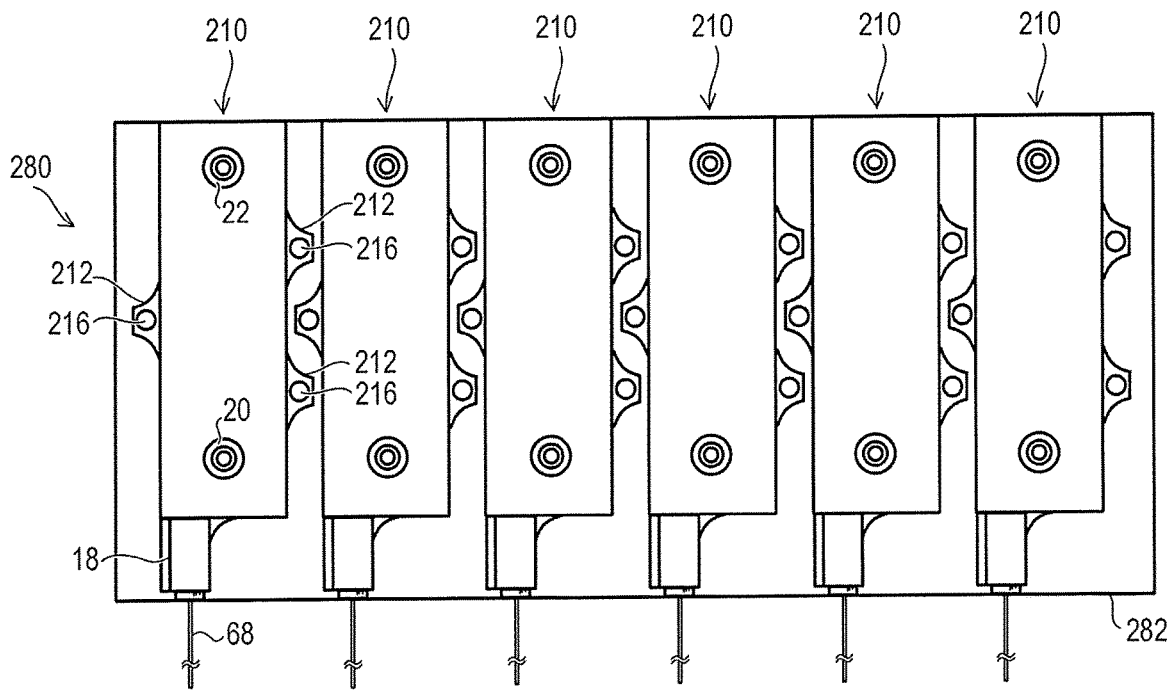
FIG. 5 is a plan view illustrating a light source apparatus according to the second embodiment of the present invention.

FIG. 5 is a plan view illustrating a light source apparatus according to the present embodiment. As illustrated in FIG. 5, the light source apparatus 280 according to the present embodiment has a substrate 282 and a plurality of laser apparatuses 210 aligned and mounted on the substrate 282. Note that, in FIG. 5, illustration of the bus bars 88 and the fixing screws 90 and 92 used for electrical connection between the terminal unit 20 and the terminal unit 22 is omitted.

Each of the plurality of laser apparatuses 210 is attached to the substrate 282 with the bottom plate 24 side facing the substrate 282 side. Each of the laser apparatuses 210 is attached and fixed to the mounting face of the substrate 282 by using fixing screws 216 that are inserted through the through holes 214 provided in respective fixing portions 212 and screwed with the internal-thread holes in the substrate 282.

As illustrated in the present embodiment, the fixing portion 212 used for attaching and fixing the laser apparatus 210 on the mounting face of the substrate 282 may be provided outside the casing 16.

Third Embodiment

A laser apparatus according to a third embodiment of the present invention will be described by using FIG. 6. Note that the same components as those of the laser apparatus and the light source apparatus according to the first and second embodiments described above are labeled with the same reference numerals, and the description thereof will be omitted or simplified.

The basic configuration of the laser apparatus according to the present embodiment is the same as the configuration of the laser apparatus 210 according to the second embodiment. The laser apparatus according to the present embodiment is different from the laser apparatus 210 according to the second embodiment in that terminal units provided outside the casing 16 are provided instead of the terminal units 20 and 22.

Figure 6:
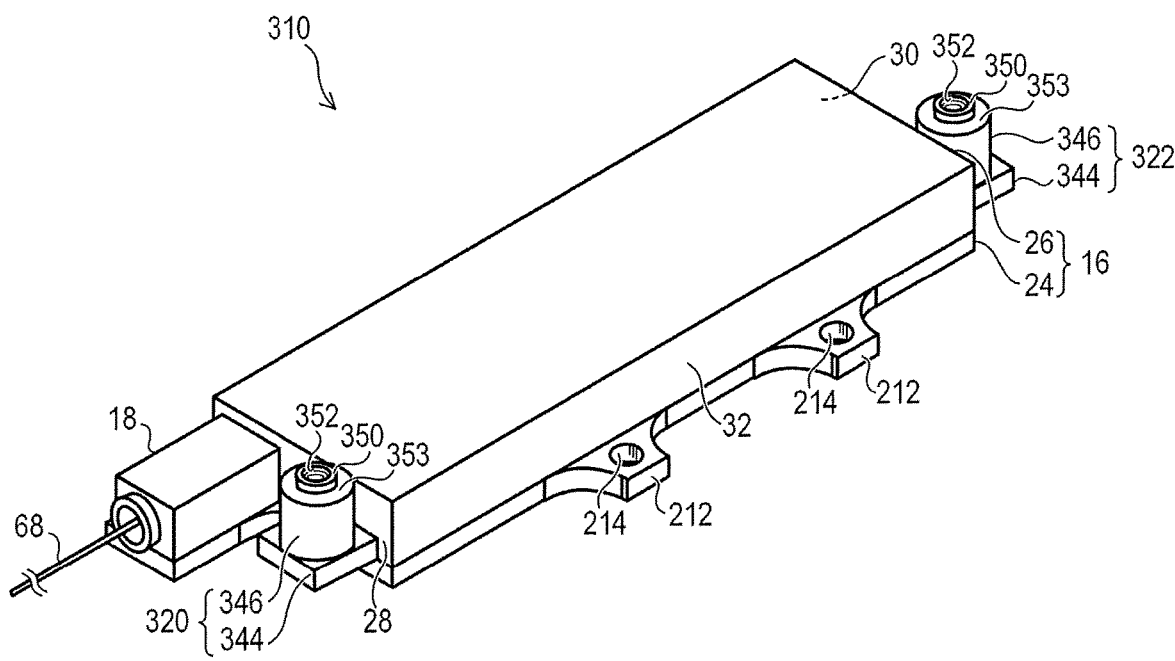
FIG. 6 is a perspective view illustrating a laser apparatus according to a third embodiment of the present invention.

FIG. 6 is a perspective view illustrating the laser apparatus according to the present embodiment. As illustrated in FIG. 6, a laser apparatus 310 according to the present embodiment has terminal units 320 and 322 provided outside the casing 16 instead of the terminal units 20 and 22.

The terminal unit 320 is provided to the front sidewall 28 of the cover 26. The terminal unit 322 is provided to the rear sidewall 30 of the cover 26. The terminal units 320 and 322 enable external electrical connection and have the same function as the terminal units 20 and 22, respectively.

Each of the terminal units 320 and 322 has the element connection portion 344 and the external connection portion 346 electrically connected to the element connection part 344. Each of the terminal units 320 and 322 has a connection form utilizing a screw for external electrical connection.

The element connection portion 344 of the terminal unit 320 is provided so as to pass through the front sidewall 28 of the cover 26 between the inside and the outside in parallel to the bottom plate 24. The element connection portion 344 of the terminal unit 320 has a sheet-like conductor (not illustrated) similar to the sheet-like conductor 48 described above. This sheet-like conductor is electrically connected to the electrode of the semiconductor laser element 12 at the front end of the alignment of the plurality of semiconductor laser elements 12 via a wire of wire bonding.

The element connection part 344 of the terminal unit 322 is provided so as to pass through the rear sidewall 30 of the cover 26 between the inside and the outside in parallel to the bottom plate 24. The element connection portion 344 of the terminal unit 322 has a sheet-like conductor (not illustrated) similar to the sheet-like conductor 48 described above. This sheet-like conductor is electrically connected to the electrode of the semiconductor laser element 12 at the rear end of the alignment of the plurality of semiconductor laser elements 12 via a wire of wire bonding.

Note that a scheme for electrically connecting the sheet-like conductor of each element connection portion 344 to the electrode of the semiconductor laser element 12 is not limited to the scheme of wire bonding, and various schemes may be used.

The external connection portion 346 of each of the terminal units 320 and 322 is provided on a portion of the element connection portion 344 outside the casing 16. The external connection portion 346 of each of the terminal units 320 and 322 has a column-like conductor 350 formed in a column shape perpendicular to the bottom plate 24, for example, as a conductive part formed of a conductor. In each of the terminal units 320 and 322, the column-like conductor 350 is electrically connected to the sheet-like conductor of the element connection portion 344. Each column-like conductor 350 has, at the upper end thereof, an internal-thread hole 352 opened upward. In such a way, the external connection portion 346 of each of the terminal units 320 and 322 is provided so as to face upward with respect to the bottom plate 24 in the same manner as the external connection portion 46 of each of the terminal units 20 and 22 in the first embodiment. That is, the external connection portion 346 that is a part of each of the terminal units 320 and 322 is provided on the opposite side of the mounting face where the bottom plate 24 is mounted and fixed and extends in a direction opposite to the mounting face.

The external connection portion 346 of each of the terminal units 320 and 322 can be externally electrically connected by utilizing a screw or a thread part screwed with the internal-thread hole 352 in the same manner as the external connection portion 46 of the terminal units 20 and described above. Further, the external connection portion 346 of the terminal units 320 and 322 may have an insulating portion 353 formed of an insulator.

As illustrated in the present embodiment, the terminal units 320 and 322 that enable external electrical connection may be provided outside the casing 16.

Note that, while the case where the terminal units 320 and 322 are provided instead of the terminal units 20 and 22 in a configuration similar to that of the laser apparatus 210 according to the second embodiment has been described above, the embodiment is not limited thereto. Also in a configuration similar to that of the laser apparatus 10 according to the first embodiment, the terminal units 320 and 322 may be provided instead of the terminal units 20 and 22.

Fourth Embodiment

A laser apparatus according to a fourth embodiment of the present invention will be described by using FIG. 7. Note that the same components as those of the laser apparatus and the light source apparatus according to the first to third embodiments described above are labeled with the same reference numerals, and the description thereof will be omitted or simplified.

The basic configuration of the laser apparatus according to the present embodiment is the same as the configuration of the laser apparatus 210 according to the second embodiment. The laser apparatus according to the present embodiment is different from the laser apparatus 210 according to the second embodiment in that terminal units having a different shape and a different external connection form from the terminal units 20 and 22 are provided instead of the terminal units 20 and 22.

Figure 7:
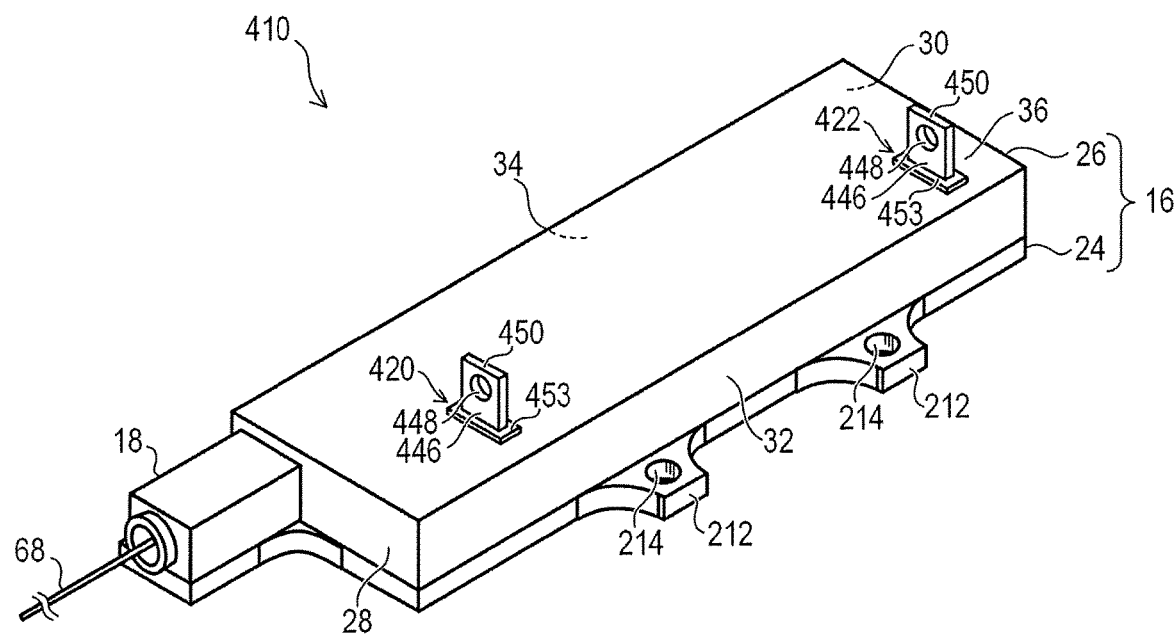
FIG. 7 is a perspective view illustrating a laser apparatus according to a fourth embodiment of the present invention.

FIG. 7 is a perspective view illustrating the laser apparatus according to the present embodiment. As illustrated in FIG. 7, a laser apparatus 410 according to the present embodiment has terminal units 420 and 422 instead of the terminal units 20 and 22.

The terminal units 420 and 422 have the same function as the terminal units 20 and 22, respectively. However, the terminal units 420 and 422 have a different shape and a different external connection form from the terminal units 20 and 22. That is, each of the terminal units 420 and 422 has a connection form utilizing an opening 448 described below for external electrical connection.

Each of the terminal units 420 and 422 has an external connection portion 446 projecting out of the casing 16 upward above the top plate 36 of the cover 26. Each external connection portion 446 partially projects out of the casing 16 from the upper face of the casing 16. Each external connection portion 446 has, as a conductive portion formed of a conductor, a plate-like conductor 450 that is orthogonal to the longitudinal direction of the casing 16. In the plate-like conductor 450 of each external connection portion 446, an opening 448 passing through in the longitudinal direction of the casing 16 is provided. Note that each external connection portion 446 is electrically connected to the element connection portion similar to the element connection portion 44 inside the casing 16. Further, the external connection portion 446 of each of the terminal units 420 and 422 may have the plate-like conductor 450 and an insulating portion 453 formed of an insulator. Furthermore, the top plate 36 has openings corresponding to the openings 54 and 56 of FIG. 1A, and these openings and the plate-like conductors 450 are in contact with each other via the insulating portions 453. Furthermore, the opening provided in the top plate 36 and the plate-like conductor 450 may be sealed via the insulating portion 453. That is, a gap between the plate-like conductor 450 and the opening may be sealed in an airtight manner by the insulating portion 453.

An external terminal can be electrically connected to the external connection portion 446 of each of the terminal units 420 and 422 by utilizing the opening 448. For example, the external terminal that is a round or Y-type crimp terminal can be fixed to the external connection portion 446 by using a bolt inserted through the opening 448 and a corresponding nut from the side of the external connection portion 446. In such a way, external terminals can be electrically connected to the terminal units 420 and 422, respectively.

As illustrated in the present embodiment, the terminal units 420 and 422 having the connection form utilizing the openings 448 may be provided instead of the terminal units 20 and 22 having the connection form utilizing screws.

Note that, while the case where the terminal units 420 and 422 are provided instead of the terminal units 20 and 22 in a configuration similar to that of the laser apparatus 210 according to the second embodiment has been described above, the embodiment is not limited thereto. Also in a configuration similar to that of the laser apparatus 10 according to the first embodiment, the terminal units 420 and 422 may be provided instead of the terminal units 20 and 22. Further, also in a configuration similar to that of the laser apparatus 310 according to the third embodiment, the terminal units 420 and 422 may be provided instead of the terminal units 320 and 322.

Fifth Embodiment

A light source apparatus according to a fifth embodiment of the present invention will be described by using FIG. 8. Note that the same components as those of the laser apparatus and the light source apparatus according to the first to fourth embodiments described above are labeled with the same reference numerals, and the description thereof will be omitted or simplified.

The basic configuration of the light source apparatus according to the present embodiment is the same as the configuration of the light source apparatus 80 according to the first embodiment. The light source apparatus according to the present embodiment is different from the light source apparatus 80 according to the first embodiment in that the oblique angle of each laser apparatus 10 relative to the alignment direction of the plurality of laser apparatuses 10 is different from the light source apparatus 80 according to the first embodiment.

Figure 8:
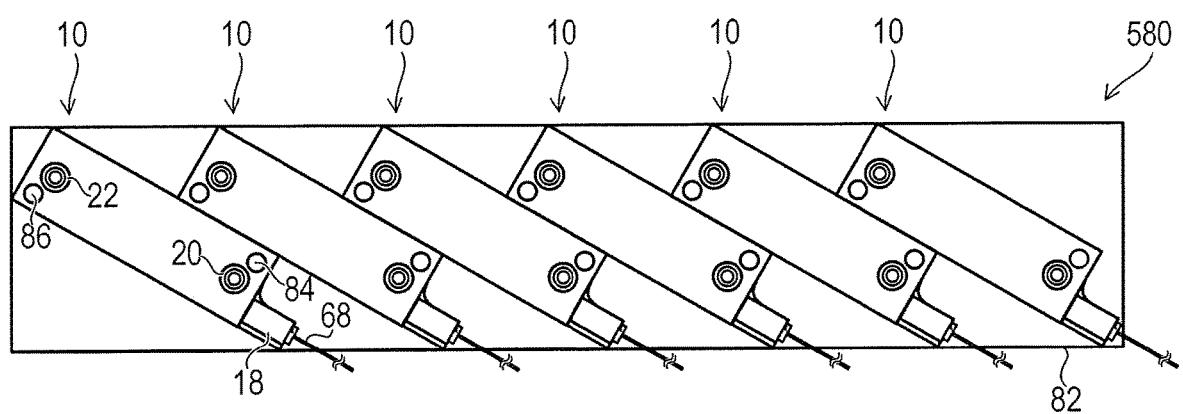
FIG. 8 is a plan view illustrating a light source apparatus according to a fifth embodiment of the present invention.

FIG. 8 is a plan view illustrating the light source apparatus according to the present embodiment. As illustrated in FIG. 8, a light source apparatus 580 according to the present embodiment has the substrate 82 and the plurality of laser apparatuses 10 aligned and mounted on the substrate 82 in a similar manner to the light source apparatus 80 according to the first embodiment. Note that, in FIG. 8, illustration of the bus bars 88 and the fixing screws 90 and 92 used for electrical connection between the terminal unit 20 and the terminal unit 22 is omitted.

In the light source apparatus 80 in the first embodiment, each of the plurality of laser apparatuses 10 is arranged such that the longitudinal direction of the casing 16 thereof is orthogonal to the alignment direction of the plurality of laser apparatuses 10, as described above.

In contrast, in the light source apparatus 580 according to the present embodiment, each of the plurality of laser apparatuses 10 is arranged such that the longitudinal direction of the casing 16 thereof is inclined at an oblique angle of an acute angle or an obtuse angle relative to the alignment direction of the plurality of laser apparatuses 10. That is, each of the laser apparatuses 10 is arranged such that the longitudinal direction of the casing 16 thereof is inclined at a predetermined oblique angle other than 90 degrees relative to the alignment direction of the plurality of laser apparatuses 10.

Note that each of the plurality of laser apparatuses 10 arranged obliquely is attached and fixed to the mounting face of the substrate 82 in the same manner as the laser apparatus 10 of the light source apparatus 80 according to the first embodiment.

As illustrated in the present embodiment, each of the plurality of laser apparatuses 10 may be arranged such that the longitudinal direction of the casing 16 of the laser apparatus 10 is inclined at an oblique angle of an acute angle or an obtuse angle relative to the alignment direction of the plurality of laser apparatuses 10.

Sixth Embodiment

A laser apparatus according to a sixth embodiment of the present invention will be described by using FIG. 9 and FIG. 10. Note that the same components as those of the laser apparatus and the light source apparatus according to the first to fifth embodiments described above are labeled with the same reference numerals, and the description thereof will be omitted or simplified.

The basic configuration of the laser apparatus according to the present embodiment is the same as the configuration of the laser apparatus 10 according to the first embodiment. The laser apparatus according to the present embodiment further has an electronic component different from the semiconductor laser element 12 and terminal units associated therewith in addition to the configuration of the laser apparatus 10 according to the first embodiment.

Figure 9:
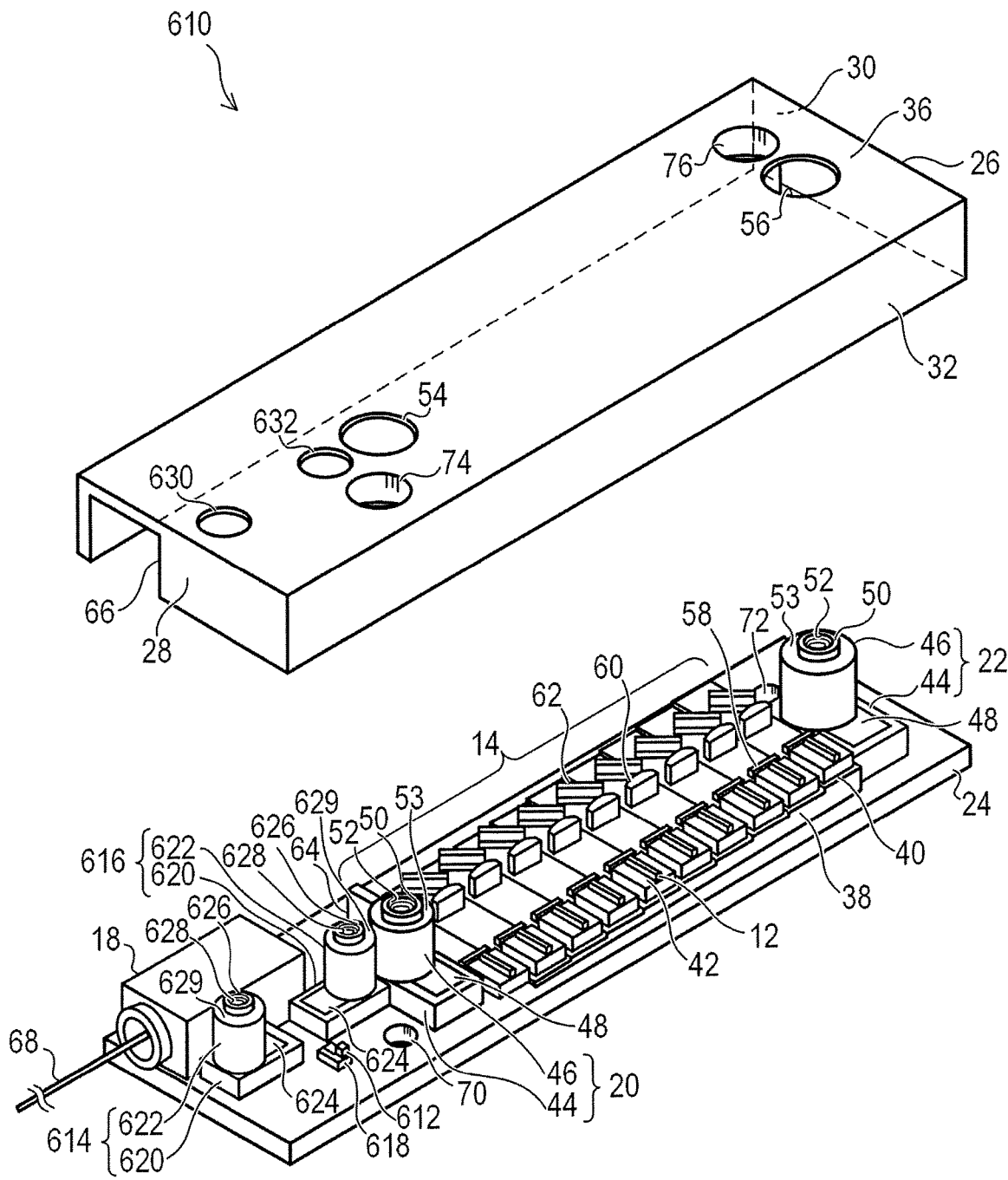
FIG. 9 is an exploded perspective view illustrating a laser apparatus according to a sixth embodiment of the present invention.

FIG. 9 is an exploded perspective view illustrating the laser apparatus according to the present embodiment. FIG. is an enlarged perspective view illustrating an electronic component in the laser apparatus according to the present embodiment.

Figure 10:
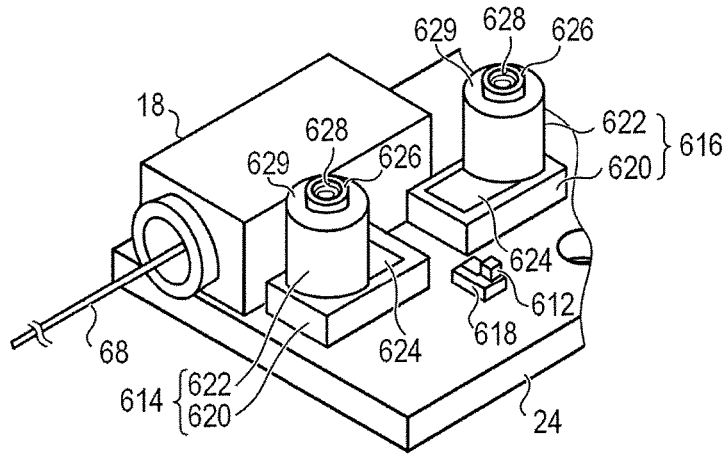
FIG. 10 is an enlarged perspective view illustrating an electronic component and terminal units in the laser apparatus according to the sixth embodiment of the present invention.

As illustrated in FIG. 9 and FIG. 10, a laser apparatus 610 according to the present embodiment has an electronic component 612 and terminal units 614 and 616 associated therewith in addition to the configuration of the laser apparatus 10 according to the first embodiment.

The electronic component 612 is accommodated inside the casing 16. Further, portions of the terminal units 614 and 616 other than portions projecting out of the casing 16 are also accommodated inside the casing 16, as described later.

The electronic component 612 is different from the semiconductor laser element 12, which may be a temperature sensor such as a thermistor that measures the temperature inside the casing 16, for example. The electronic component 612 is mounted on a region of the bottom plate 24 near the output unit 18. For example, the electronic component 612 is mounted on the bottom plate 24 in a form of COS by being fixed and mounted by solder or the like on the submount 618. The bottom plate 24 is expanded compared to that of the first embodiment in order to provide the electronic component 612 and the terminal units 614 and 616.

Note that the electronic component 612 is not limited to a temperature sensor. The electronic component 612 may be a photodetector such as a photodiode, for example.

The terminal units 614 and 616 associated with the electronic component 612 are mounted on regions of the bottom plate 24 near the electronic component 612 inside the casing 16, respectively. The terminal units 614 and 616 are electrically connected to an external circuit unit associated with the electronic component 612, respectively, to implement the function of the electronic component 612. When the electronic component 612 is a temperature sensor such as a thermistor, the terminal units 614 and 616 are connected to predetermined terminals of a temperature measuring circuit, respectively, and thereby temperature measurement by using a temperature sensor is realized.

Each of the terminal units 614 and 616 has a component connection portion 620 and an external connection portion 622 electrically connected to the component connection portion 620. Each of the terminal units 614 and 616 has a connection form utilizing a screw for external electrical connection. The component connection portion 620 and the external connection portion 622 of the terminal units 614 and 616 have the same configuration as the element connection portion 44 and the external connection portion 46 of the terminal units 20 and 22, respectively.

The component connection portion 620 of each of the terminal units 614 and 616 is provided on the bottom plate 24. In such a way, the component connection portion 620 that is a part of each of the terminal units 614 and 616 is provided on the bottom plate 24. The component connection portion 620 of each of the terminal units 614 and 616 has a sheet-like conductor 624. The sheet-like conductor 624 is provided in parallel to the bottom plate 24. The sheet-like conductor 624 is electrically connected to the electrode of the electronic component 612 via a wire of wire bonding, for example.

More specifically, the sheet-like conductor 624 of the component connection portion 620 in the terminal unit 614 is electrically connected to one of the electrodes of the electronic component 612 via a wire of wire bonding. Further, the sheet-like conductor 624 of the component connection portion 620 in the terminal unit 616 is electrically connected to the other electrode of the electronic component 612 via a wire of wire bonding. Note that a scheme for electrically connecting the sheet-like conductor 624 of the component connection portion 620 to the electrode of the electronic component 612 is not limited to the scheme of wire bonding, and various schemes may be used.

The external connection portion 622 of each of the terminal units 614 and 616 is provided on the component connection portion 620. The external connection portion 622 of each of the terminal units 614 and 616 has a column-like conductor 626 formed in a column shape perpendicular to the bottom plate 24, for example, as a conductive part formed of a conductor. In each of the terminal units 614 and 616, the column-like conductor 626 is electrically connected to the sheet-like conductor 624. Each column-like conductor 626 has, at the upper end thereof, an internal-thread hole 628 opened upward. Each internal-thread hole 628 is used for external electrical connection as described later. In such a way, the external connection portion 622 of each of the terminal units 614 and 616 is provided so as to face upward with respect to the bottom plate 24 in the same manner as the external connection portion 46 of each of the terminal units 20 and 22. That is, the external connection portion 622 that is a part of each of the terminal units 614 and 616 is provided on the opposite side of the mounting face where the bottom plate 24 is mounted and fixed and extends in a direction opposite to the mounting face.

Openings 630 and 632 are provided in the top plate 36 of the cover 26 correspondingly to the external connection portion 622 of the terminal units 614 and 616, respectively. The external connection portions 622 of the terminal units 614 and 616 partially projects above the top plate 36, that is, out of the casing 16 via the openings 630 and 632 provided in the top plate 36, respectively. In such a way, the external connection portions 622 of the terminal units 614 and 616 partially project out of the casing 16 from the upper face of the casing 16, respectively. Each external connection portion 622 partially projecting out of the casing 16 directs the internal-thread hole 628 upward. Note that the cover 26 is expanded to correspond to the expanded bottom plate 24 compared to that of the first embodiment in order to accommodate the electronic component 612 and terminal units 614 and 616 inside the casing 16. Further, the external connection portions 622 of the terminal units 614 and 616 may each have an insulating portion 629 formed of an insulator. The opening 630 and 632 provided in the top plate 36 and the column-like conductors 626 are in contact with each other via the insulating portions 629. Furthermore, the opening 630 and 632 provided in the top plate 36 and the column-like conductors 626 may be sealed with each other via the insulating portions 629. That is, gaps between the column-like conductor 626 and the opening 630 and between the column-like conductor 626 and the opening 632 may be sealed in an airtight manner by the insulating portions 629.

The external connection portion 622 of each of the terminal units 614 and 616 can be externally electrically connected by utilizing a screw or a thread part that screwed with the internal-thread hole 628. For example, with a use of a screw that is screwed in the internal-thread hole 628, a bus bar that is a conductive bar is fixed to the external connection portion 622 in contact with the column-like conductor 626, and the external connection portion 622 enable external electrical connection via the fixed bus bar. Further, an external terminal having an external-thread part screwed with the internal-thread hole 628 can be used to screw and fix the external-thread part of the external terminal with and to the internal-thread hole 628, and the external connection portion 622 can be externally electrically connected via the fixed external terminal. Further, an external terminal that is a round or Y-type crimp terminal, for example, can be fixed to the external connection portion 622 in contact with the column-like conductor 626 by using an external-thread screw screwed with the internal-thread hole 628, and the external connection portion 622 can be externally electrically connected via the fixed external terminal.

As illustrated in the present embodiment, the electronic component 612 and the terminal units 614 and 616 associated therewith may be further provided. In this case, the terminal units 614 and 616 associated with the electronic component 612 are provided so as to face upward with respect to the bottom plate 24 mounted on the mounting face of the substrate. Thus, as with the terminal units 20 and 22, it is not necessary to secure the space for the terminal units 614 and 616 when a light source apparatus is configured, and the footprint of the light source apparatus can be reduced. Thereby, space-saving can be realized.

Further, each of the terminal units 614 and 616 also has the internal-thread hole 628 and is externally electrically connected by a screw. Thus, also for the terminal units 614 and 616, it is not necessary to perform soldering as in the case of using lead pins, and it is possible to ensure good work efficiency in external electrical connection.

Note that, while the case where the electronic component 612 and the terminal units 614 and 616 are provided in addition to the configuration of the laser apparatus 10 according to the first embodiment has been described above, the embodiment is not limited thereto. The electronic component 612 and the terminal units 614 and 616 may be provided in addition to the configuration of the laser apparatus 210, 310, or 410 according to the second, third, or fourth embodiment.

Further, the terminal units 614 and 616 associated with the electronic component 612 may be provided outside the casing 16 in a similar manner to the terminal units 320 and 322 in the third embodiment. Further, the terminal units 614 and 616 associated with the electronic component 612 may have a connection form utilizing openings in a similar manner to the terminal units 420 and 422 in the fourth embodiment.

Modified Embodiments

The present invention is not limited to the embodiments described above, and various modifications are possible.

For example, while the cases where the laser apparatuses 10, 210, 310, 410, and 610 each have the plurality of semiconductor laser elements 12 have been described as examples in the above embodiment, the invention is not limited thereto. The laser apparatus 10, 210, 310, 410, or 610 may have a single semiconductor laser element 12.

Further, while the cases where the terminal units 20 and 22 each have the internal-thread hole 52 and the terminal units 320 and 322 each have the internal-thread hole 352 have been described as examples in the above embodiments, the invention is not limited thereto. Each of the terminal units 20 and 22 or the terminal units 320 and 322 may be a terminal unit which has an external-thread part used for external electrical connection instead of the internal-thread holes 52 and 352, respectively. In this case, for example, a nut screwed with the external-thread part or the like can be used to fix an external terminal in contact with the external-thread part to the terminal unit 20, 22, 320, or 322 by a ring part inserted in the external-thread part or the like. With respect to the terminal units 614 and 616 associated with the electronic component 612, a terminal unit having an external-thread part may be used in the same manner.

Further, while terminal units having the connection form utilizing screws or openings have been described as the terminal units 20, 22, 320, 322, 420, and 422 as examples in the above embodiments, the invention is not limited thereto, and other connection forms may be used. For example, the terminal unit 20, 22, 320, 322, 420, or 422 may have a connection form utilizing a jack into which a plug such as a banana plug can be inserted. With respect to the terminal units 614 and 616 associated with the electronic component 612, a terminal unit of other connection forms may be used in the same manner.

Further, while the cases where the plurality of laser apparatuses 10 are mounted on the substrate 82 and the plurality of laser apparatuses 210 are mounted on the substrate 282 have been described as examples in the above embodiments, the invention is not limited thereto. The plurality of laser apparatuses 10 or 210 can be mounted on a mounting face of various base members such as a mounting stage other than the substrate 82 or 282.

Further, while the case where the output units 18 of the plurality of laser apparatuses 10 aligned in a line face the same side with respect to the alignment direction as illustrated in FIG. 2A and FIG. 2B has been described as an example in the above embodiments, the invention is not limited thereto. For example, the output units 18 of the plurality of laser apparatuses 10 aligned in a line may face one side and the other side in an alternating manner with respect to the alignment. In this case, since the terminal unit 20 and the terminal unit 22 to be connected by the bus bar 88 of two adjacent laser apparatuses 10 are located on the same side, the length of the bus bar 88 can be reduced, and therefore the electrical connection path can be reduced.

Further, while the case where the light source apparatus 80 is used as an excitation light source of the optical fiber laser 94 as illustrated in FIG. 3 has been described as an example in the above embodiments, the invention is not limited thereto. The light source apparatus 80 can be used as a light source of various devices or systems such as a device for combining wavelengths, a device for combining polarized waves, or the like. Further, the light source apparatus 80 can be sued as a direct diode laser. For example, the light source apparatus 80 can be used together with an optical system which a laser light output from the plurality of laser apparatuses 10 enters. The optical system may include a lens such as a converging lens, a combiner, a mirror, or the like.

More specifically, laser lights output from the plurality of laser apparatuses 10 in the light source apparatus 80 can be converted by the optical system including a lens and output. Further, laser lights output from the plurality of laser apparatuses 10 in the light source apparatus 80 can be coupled by a combiner and output. Note that the laser characteristics such as wavelengths of laser lights of the plurality of laser apparatuses 10 in the light source apparatus 80 may be the same as or different from each other. The laser characteristics of the plurality of laser apparatuses 10 may be set as appropriate in accordance with application of the light source apparatus 80.

LIST OF REFERENCE NUMERALS 10, 210, 310, 410, 610: laser apparatus
12: semiconductor laser element
16: casing
18: output unit
20, 320, 420: terminal unit
22, 322, 422: terminal unit
80, 280, 580: light source apparatus
82: substrate
94: optical fiber laser
96: pump combiner
98: rare-earth additive optical fiber
612: electronic component
614: terminal unit
616: terminal unit

The invention claimed is:

1. A laser apparatus comprising:
a bottom plate;
a semiconductor laser element mounted on the bottom plate;
a terminal unit that is provided so as to face upward with respect to the bottom plate and enables external electrical connection; and
a casing having the bottom plate, wherein:
the casing accommodates the semiconductor laser element,
the terminal unit is provided on the bottom plate inside the casing, and
the terminal unit has an external connection portion projecting, out of the casing.

2. The laser apparatus according to claim 1, wherein a part of the terminal unit is provided on the bottom plate.

3. The laser apparatus according to claim 1, wherein the external connection portion has an insulating portion formed of an insulator.

4. The laser apparatus according to claim 3,
wherein the casing has a top plate facing the bottom plate,
wherein an opening corresponding to the external connection portion is provided in the top plate,
wherein the external connection portion has a conductive portion formed of a conductor, and
wherein the conductive portion and the opening are in contact with each other via the insulating portion.

5. The laser apparatus according to claim 4, wherein the conductive portion and the opening are sealed via the insulating portion.

6. The laser apparatus according to claim 1, wherein the external connection portion projects out of the casing from an upper face of the casing.

7. The laser apparatus according to claim 1, wherein the terminal unit has an element connection portion electrically connected to the semiconductor laser element.

8. The laser apparatus according to claim 1 further comprising an electronic component that is mounted on the bottom plate and is different from the semiconductor laser element,
wherein the terminal unit has a component connection portion electrically connected to the electronic component.

9. A laser apparatus comprising:
a bottom plate;
a semiconductor laser element mounted on the bottom plate;
a terminal unit that is provided so as to face upward with respect to the bottom plate and enables external electrical connection, wherein the terminal unit has an internal-thread hole or an external-thread part used for the external electrical connection.

10. The laser apparatus according to claim 1 further comprising:
an output unit that outputs a laser light output from the semiconductor laser element through an optical fiber; and
an optical system that causes the laser light to enter one end of the optical fiber.

11. A light source apparatus comprising:
a plurality of laser apparatuses according to claim 1; and
a base member having a mounting face on which the plurality of laser apparatuses are mounted.

12. The light source apparatus according to claim 11 further comprising an optical system which laser lights output from the plurality of laser apparatuses enter.

13. An optical fiber laser comprising:
the light source apparatus according to claim 11;
an amplifier optical fiber; and
an incidence unit that causes laser lights output from the plurality of laser apparatuses of the light source apparatus to enter the amplifier optical fiber.

14. An optical fiber laser comprising:
a light source apparatus comprising:
a plurality of laser apparatuses, each laser apparatus comprising:
a bottom plate,
a semiconductor laser element mounted on the bottom plate, and
a terminal unit that is provided so as to face upward with respect to the bottom plate and enables external electrical connection;
a base member having a mounting face on which the plurality of laser apparatuses are mounted; and
an optical system into which laser lights output from the plurality of laser apparatuses enter;
an amplifier optical fiber; and
an incidence unit that causes laser lights output from the plurality of laser apparatuses of the light source apparatus to enter the amplifier optical fiber.

* * * * *